(12) United States Patent
Brunschwiler et al.

(10) Patent No.: US 8,107,234 B2
(45) Date of Patent: Jan. 31, 2012

(54) VARIABLE FLOW COMPUTER COOLING SYSTEM FOR A DATA CENTER AND METHOD OF OPERATION

(75) Inventors: Thomas J. Brunschwiler, Rueschlikon (CH); Ryan J. Linderman, Rueschlikon (CH); Bruno Michel, Rueschlikon (CH); Erich M. Ruetsche, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/793,896

(22) Filed: Jun. 4, 2010

(65) Prior Publication Data
US 2010/0246117 A1    Sep. 30, 2010

Related U.S. Application Data

(63) Continuation of application No. 12/038,894, filed on Feb. 28, 2008, now Pat. No. 7,808,780.

(51) Int. Cl.
*G06F 1/20* (2006.01)
*H05K 7/20* (2006.01)

(52) U.S. Cl. ......... 361/679.53; 361/679.47; 361/679.54; 361/699; 361/702; 361/704; 165/104.33; 165/185

(58) Field of Classification Search .......... 361/679.46–679.47, 679.53–679.54, 361/699, 702, 704, 707, 718, 722; 165/80.4, 165/104.33, 185, 908
See application file for complete search history.

(56) References Cited

U.S. PATENT DOCUMENTS

| 5,361,188 A | 11/1994 | Kondou et al. |
| 5,768,103 A | 6/1998 | Kobrinetz et al. |
| 6,257,329 B1 | 7/2001 | Balzano |
| 6,313,990 B1 | 11/2001 | Cheon |
| 6,519,148 B2 | 2/2003 | Nakagawa et al. |

(Continued)

FOREIGN PATENT DOCUMENTS
EP    0766308 A2    2/1997
(Continued)

OTHER PUBLICATIONS

E. Colgan et al. "A Practical Implementation of Silicon Microchannel Coolers for High Power Chips" IEEE Transactions on Components and Packaging Technologies. Jun. 2007, p. 218-225, vol. 30, No. 2, IEEE.

(Continued)

*Primary Examiner* — Robert J Hoffberg
(74) *Attorney, Agent, or Firm* — Cantor Colburn LLP; Daniel Morris

(57) ABSTRACT

Disclosed herein is a data center having a plurality of liquid cooled computer systems. The computer systems each include a processor coupled with a cold plate that allows direct liquid cooling of the processor. The cold plate is further arranged to provide adapted flow of coolant to different portions of the processor whereby higher temperature regions receive a larger flow rate of coolant. The flow is variably adjusted to reflect different levels of activity. By maximizing the coolant temperature exiting the computer systems, the system may utilize the free cooling temperature of the ambient air and eliminate the need for a chiller. A data center is further provided that is coupled with a district heating system and heat is extracted from the computer systems is used to offset carbon emissions and reduce the total cost of ownership of the data center.

15 Claims, 14 Drawing Sheets

U.S. PATENT DOCUMENTS

| | | | |
|---|---|---|---|
| 6,587,346 B1 | 7/2003 | Parker | |
| 6,608,751 B2 | 8/2003 | Ishimine et al. | |
| 6,626,233 B1 * | 9/2003 | Connors | 165/80.3 |
| 6,650,542 B1 | 11/2003 | Chrysler et al. | |
| 6,657,121 B2 * | 12/2003 | Garner | 174/16.3 |
| 6,775,997 B2 | 8/2004 | Bash et al. | |
| 6,842,340 B2 | 1/2005 | Chang | |
| 6,945,058 B2 | 9/2005 | Bash et al. | |
| 6,952,346 B2 * | 10/2005 | Tilton et al. | 361/699 |
| 6,970,355 B2 | 11/2005 | Ellsworth, Jr. et al. | |
| 6,972,365 B2 * | 12/2005 | Garner | 174/16.3 |
| 7,000,684 B2 | 2/2006 | Kenny et al. | |
| 7,071,408 B2 * | 7/2006 | Garner | 174/16.3 |
| 7,072,185 B1 | 7/2006 | Belady et al. | |
| 7,104,312 B2 | 9/2006 | Goodson et al. | |
| 7,114,550 B2 | 10/2006 | Nakahama et al. | |
| 7,159,414 B2 | 1/2007 | Tilton et al. | |
| 7,173,820 B2 | 2/2007 | Fink et al. | |
| 7,298,617 B2 | 11/2007 | Campbell et al. | |
| 7,808,780 B2 * | 10/2010 | Brunschwiler et al. | 361/679.53 |
| 2002/0091468 A1 | 7/2002 | Nagashima et al. | |
| 2002/0117291 A1 | 8/2002 | Cheon | |
| 2003/0035269 A1 | 2/2003 | Chiu | |
| 2003/0147214 A1 | 8/2003 | Patel et al. | |
| 2003/0158718 A1 | 8/2003 | Nakagawa et al. | |
| 2004/0112585 A1 | 6/2004 | Goodson et al. | |
| 2005/0168941 A1 | 8/2005 | Sokol et al. | |
| 2005/0259397 A1 | 11/2005 | Bash et al. | |
| 2006/0065000 A1 | 3/2006 | Belady | |
| 2006/0086119 A1 | 4/2006 | Malone et al. | |
| 2006/0176665 A1 | 8/2006 | Matsushima et al. | |
| 2006/0279935 A1 | 12/2006 | Karidis et al. | |
| 2007/0002536 A1 | 1/2007 | Hall et al. | |
| 2007/0119565 A1 | 5/2007 | Brunschwiler et al. | |
| 2007/0213000 A1 | 9/2007 | Day | |
| 2009/0234705 A1 * | 9/2009 | Brunschwiler et al. | 705/10 |
| 2009/0284921 A1 | 11/2009 | Colgan et al. | |

FOREIGN PATENT DOCUMENTS

| | | |
|---|---|---|
| EP | 1662852 A1 | 5/2006 |
| WO | 2004042297 A3 | 5/2004 |
| WO | 2007139560 A1 | 12/2007 |

OTHER PUBLICATIONS

T. Brunschwiler et al., "Direct Liquid Jet-Impingement Cooling With Micron-Sized Nozzle Array and Distributed Return Architecture", 2006, p. 196-203, 0-7803-9524-7/06, IEEE.

U.S. Appl. No. 12/793,905; First Office Action; Date filed: Jun. 4, 2010; Date Mailed: Sep. 28, 2010.

* cited by examiner

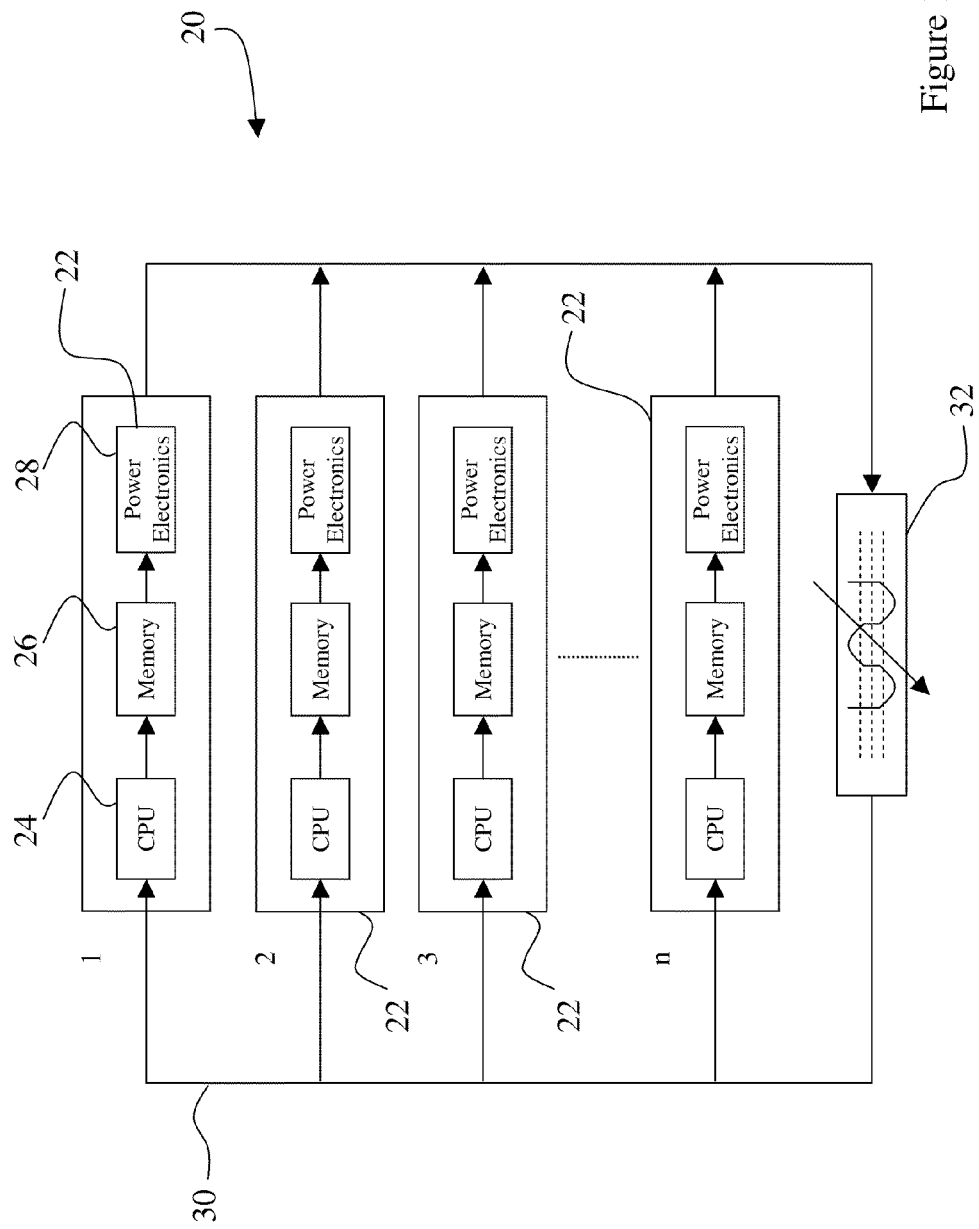

VARIABLE FLOW COMPUTER COOLING SYSTEM FOR A DATA CENTER AND METHOD OF OPERATION

CROSS-REFERENCE TO RELATED APPLICATION

This application is a continuation of U.S. patent application Ser. No. 12/038,894, filed Feb. 28, 2008, the disclosure of which is incorporated by reference herein in its entirety.

BACKGROUND

This disclosure relates to a data center having liquid cooled computers and in particular to a data center having a cooling system that maximizes the coolant output temperature while maintaining a desired processor chip temperature.

Data centers are facilities that house numerous computers systems. These computer systems are arranged to provide computer-processing services to users. Typically, the computer systems are arranged in racks that electrically connect the individual computers to the users and other computers. A standard size rack may accommodate up to 40 to 80 computer systems. The computer systems may include a number of components, including one or more processors, micro controllers, semiconductors, memory devices and the like. Each data center may have many racks of computer systems operating simultaneously.

During operation, the computer systems generate significant amounts of thermal energy. Typically, each computer system may generate on the order of 200 W-250 W of heat. In general, the semiconductors, such as CMOS based semiconductors have faster performance and lower power usage when operated at colder temperatures. Therefore, for reliability and performance reasons, the data centers include extensive cooling systems to dissipate the heat generated by the computer systems. Further, racks are usually located within a specially designed room that maintains proper environmental conditions by the cooling and conditioning of the air. The cooling of the computer systems is accomplished by moving the cool and conditioned air over the computer systems. The air is subsequently removed from the room and reconditioned for subsequent use. The cooling system for the data center may include a number of components. These components include one or more chillers, humidifiers, air conditioning compressors, condensers, fans and pumps.

Data centers are considered a more cost effective computing arrangement since the computer centers in a data center being shared among multiple users have a much higher utilization rate, on the order of 25%. This utilization is much higher than distributed personal computers and servers that typically have a utilization rate of 1-3%. However, the typical data center has an electrical efficiency of only 30% since the ancillary equipment needed for operations consume the remaining 70% of electrical power used by the data center. Since the computer systems used in the data centers continue to operate at faster speeds, the corresponding thermal energy produced will also be higher. Therefore, the cooling system and power conditioning required for the operation of the data centers will continue to consume an increasingly larger portion of the electrical power used by the data center.

The cooling systems used in the data center are sized to perform under maximum, or worst case situations. Typically, a data center will operate at maximum operating conditions for less than 10% of the time. Therefore, for a large portion of the time, the cooling system is under-utilized but still consuming a large amount of electrical power. The size of the cooling system is further complicated by the thermal resistance between the computer system components, such as the processor for example, and the air. To provide adequate performance, the cooling system needs to cool the air to provide a 60° C. temperature gradient between the computer processor and the cooling air. Therefore, if the data center desires to operate the computer processor between 75° C.-85° C., the cooling system needs to provide air at a maximum of 25° C. Due to inefficiencies in the distribution of air within the data center, the operating point for the conditioning system usually needs to be considerably less.

As a result of the complexities of existing data center cooling systems, the data centers have considerable electrical power requirements. A recent study estimates that the waste energy from a small data center is equivalent to almost 3250 MWh of fossil fuel and 630 tons of carbon dioxide per year. In light of treaties entered into to help lower emissions of greenhouse gases, some countries have introduced a taxing schema that charges producers of carbon monoxide emissions. These taxes may range as high as $85/ton of carbon dioxide. The taxing of emissions can therefore have a dramatic impact on the financial viability of a data centers.

While existing cooling systems for data center are adequate for their intended purposes, it is desirable to have a data center that requires less electrical power for its ancillary equipment and also provides a smaller or zero carbon emission.

SUMMARY

A data center is provided having a plurality of computer systems. Each of the computer systems has at least one processor, a plurality of electrical components and power electronics. A liquid cooling loop is fluidly coupled to each of the processors associated with said plurality of computer systems. The liquid cooling loop containing a liquid coolant. A first plurality of coolant control devices is coupled to the liquid cooling loop where each of the first plurality of coolant control devices is associated with and arranged to control the flow of coolant to the processors. Further, a heat exchanger is coupled to the liquid cooling loop.

A computer system is also provided having a processor with a first side and a second side. A group of electronic components is electrically coupled to the processor. A power converter is electrically coupled to provide electrical power to the processor and the group of electronic components. A liquid cooling loop is thermally coupled to the processor, the group of electronic components and the power converter. A cold plate is thermally coupled to the processor and fluidly coupled to the liquid cooling loop. The cold plate includes a first plurality of nozzles having a first diameter and a second plurality of nozzles having a second diameter. The first plurality of nozzles and the second plurality of nozzles directly fluidly couple the processor first side to the liquid cooling loop.

The method of operating a computer cooling system is also provided. The method includes the step of determining a power map of a processor wherein the power map includes a first portion at a first heat flux and a second portion at a second heat flux. Coolant is flowed at a first flow rate and a third temperature to the first portion. Coolant is also flowed at a second flow rate at the third temperature to the second portion. The coolant is then heated to a fourth temperature with the processor. Coolant is then flowed at the fourth temperature to memory components. Coolant is then heated to a fifth temperature with the memory components. Coolant is then flowed at the fifth temperature to a power converter and other electronic components. Coolant is finally heated to a sixth temperature with the power converter and other electronic components.

BRIEF DESCRIPTION OF FIGURES

FIG. 1 is a schematic illustration of an exemplary embodiment data center;

DETAILED DESCRIPTION

Figure 2A:
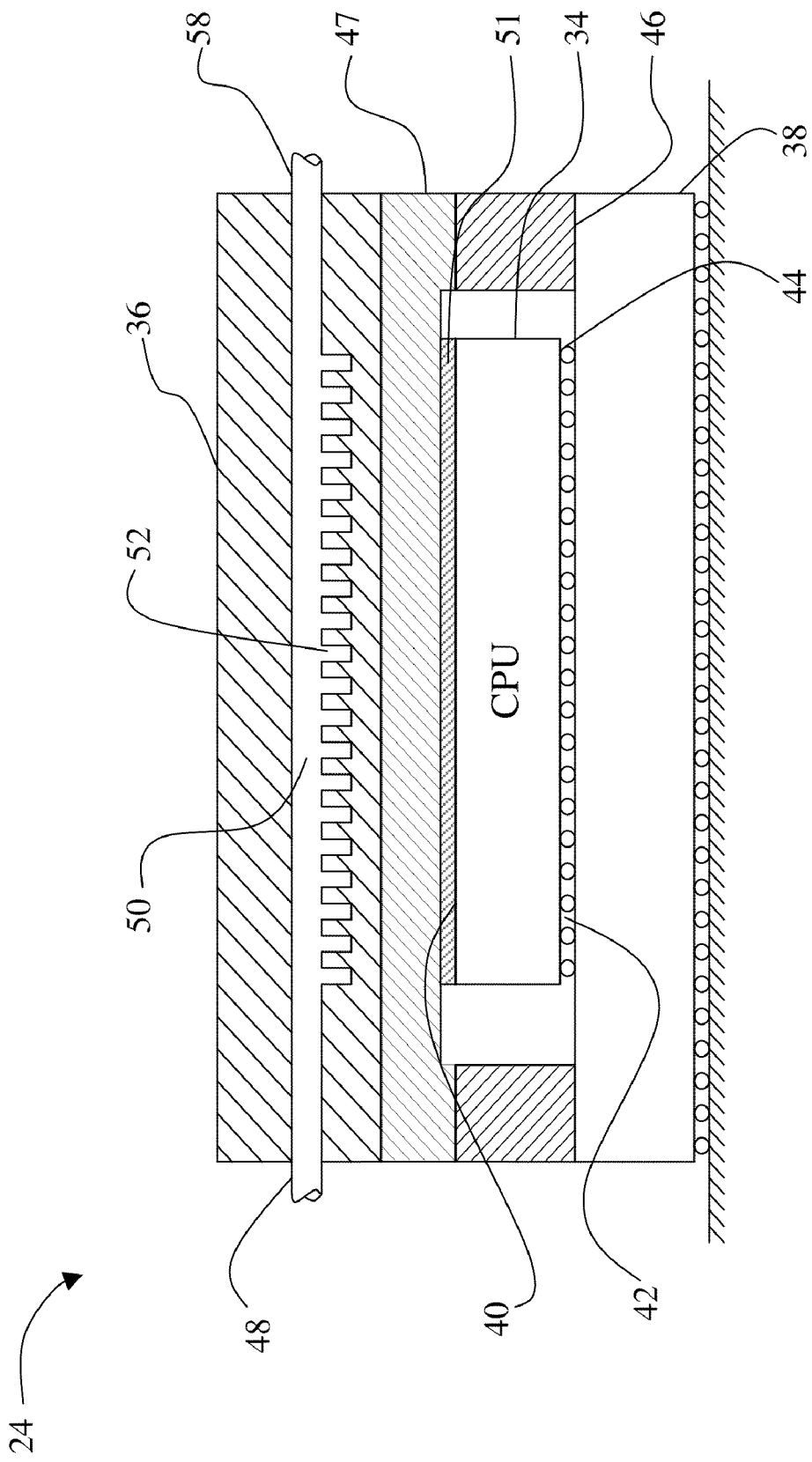
FIG. 2A-2B are side plan views of a liquid cooled processor used in the data center of FIG. 1.

The use of the terms "a" and "an" and "the" and similar references in the context of describing the invention (especially in the context of the following claims) are to be construed to cover both the singular and the plural, unless otherwise indicated herein or clearly contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

With reference now to FIG. 1 an exemplary depiction of a data center 20 is illustrated. The data center 20 includes a plurality of computer systems 22 that are arranged to provide computer-processing services. Each of the computer systems includes one or more processors 24 and the associated electronic components 26, such as random access memory or read only memory for example, that are commonly used in computer data center systems. Each computer system 22 further includes power electronics module 28 that provides components such as dc-dc power converters that condition the input electrical power to have the electrical characteristics needed by the computer system 22.

It should be appreciated that while only four computer systems 22 are illustrated in FIG. 1, the data center 20 may have any number of computer systems 22, up to 100 racks with 40 computer systems 22 in each rack for example. Further, while the descriptions herein refer to a singular processor, the computer system 22 may include multiple processors. The computer system 22 may also contain a multiple chip module ("MCM"). An MCM is an electronic package including multiple integrated circuits that are packaged together in a manner that allows the system to operate as a single integrated circuit.

As will be discussed in more detail below, each of the computer systems 22 is coupled to a liquid cooling system 30. The cooling system 30 transports a liquid coolant, such as water, glycol or a mixture of water and glycol for example, to each of the computer systems 22. In one embodiment, the cooling system 30 enters the computer system 22 and cools the processor 24 components first. After cooling the processor 24, the memory chips 26 are cooled. Finally, other electronic components including DC-DC converters 28 are cooled. In this embodiment, the component with the least tolerance for thermal variance (e.g. the processor chip) is cooled first and components with the highest tolerance for thermal variance (e.g. power converters) are cooled last. In this manner, the cooling system 30 may be sized to maximize the output temperature of the coolant from each computer system 22. This provides advantages in increasing the efficiency of the cooling system 30 and provides the opportunity for further utilization of the generated thermal energy. To ensure a maximal temperature of the coolant a controllable valve (126) is used at the entrance of each computer system which will be closed when the computer systems is switched off and will be fully open when the computer system operates at full power.

The cooling loop further includes a heat exchanger 32 that provides a means for removing the thermal energy absorbed by the coolant. As will be discussed in more detail below, the use of a liquid cooling system 30 allows a smaller thermal gradient between the coolant and the processor 24. This decrease in thermal gradient eliminates the need to provide secondary chilling and allows the thermal energy to be removed using ambient air. It should be appreciated that while the heat exchanger 32 is illustrated as a single component, it may be composed of several devices, such as but not limited to a roof cooler, a passive radiator, a cooling tower or a shell and tube heat exchanger for example.

Figure 2B:
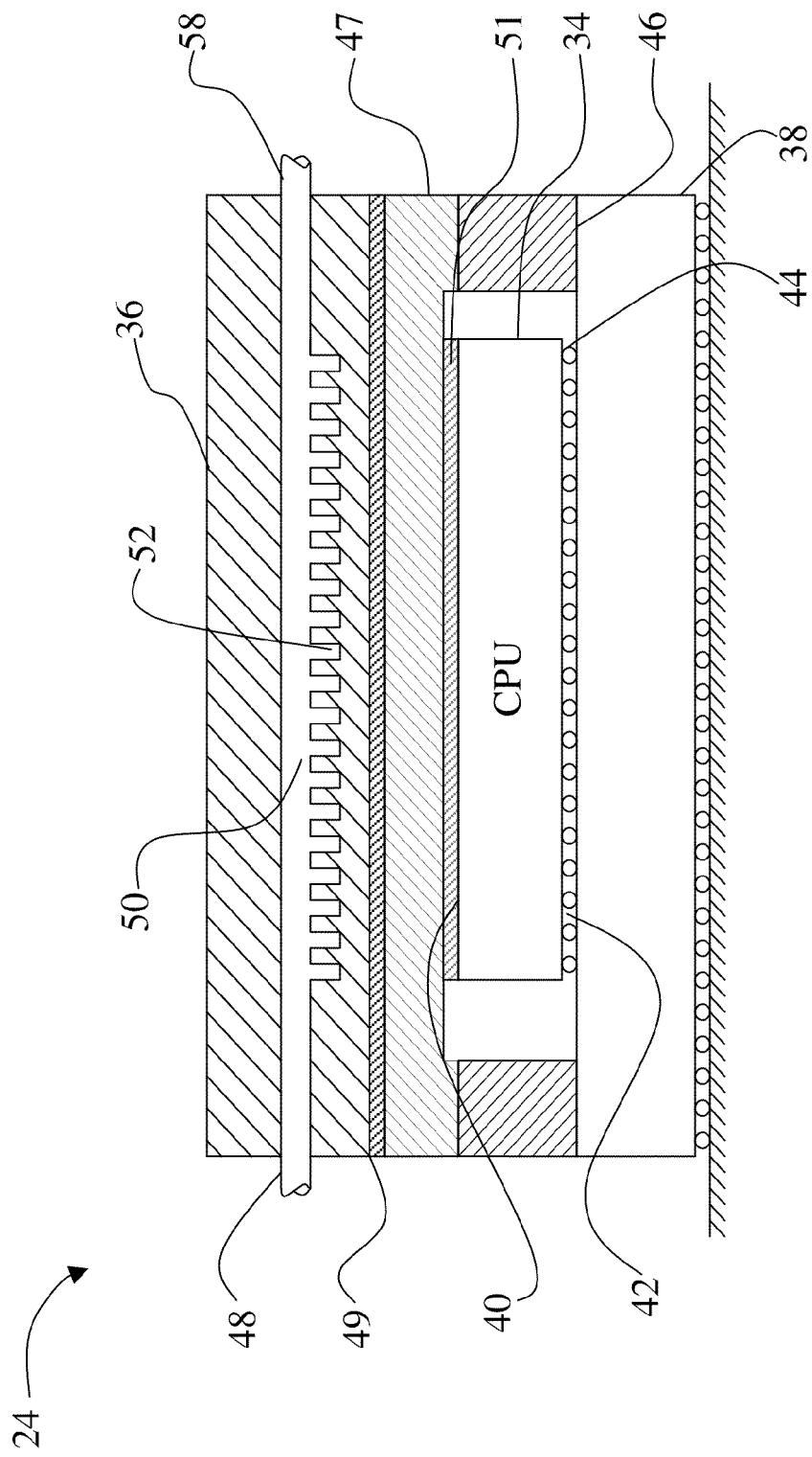

An exemplary embodiment liquid cooled processor 24 is illustrated in FIG. 2A and FIG. 2B. In this embodiment, the processor chip 34 has a first 40 and second 42 face. The first face 40 is in contact and thermal communication with cold plate 36. The cold plate 36 is illustrated in FIG. 2A and FIG. 2B as a direct processor chip backside cold plate. It is known to a person skilled in the art that a thermal interface 51 may be arranged between the processor chip 34 and the processor chip cap 47 as shown in FIG. 2A. Alternatively, two thermal interfaces 49, 51 may be used as illustrated in FIG. 2B. In the embodiment of FIG. 2B, a first thermal interface 49 is arranged between the cold plate 36 and the processor chip cap 47. A second thermal interface 51 is arranged between the processor chip 34 and the processor chip cap 47. The second side or active side 42 of processor chip 34 is laterally spaced from a package substrate 38 by a plurality of solder balls 44. A spacer 46 is positioned adjacent the processor chip 34 between the cold plate 36 and the substrate package 38. Similar cold plate arrangements as illustrated in FIG. 2A and FIG. 2B may also be used for cooling of memory chips 26 and power electronic components 28.

Figure 3:
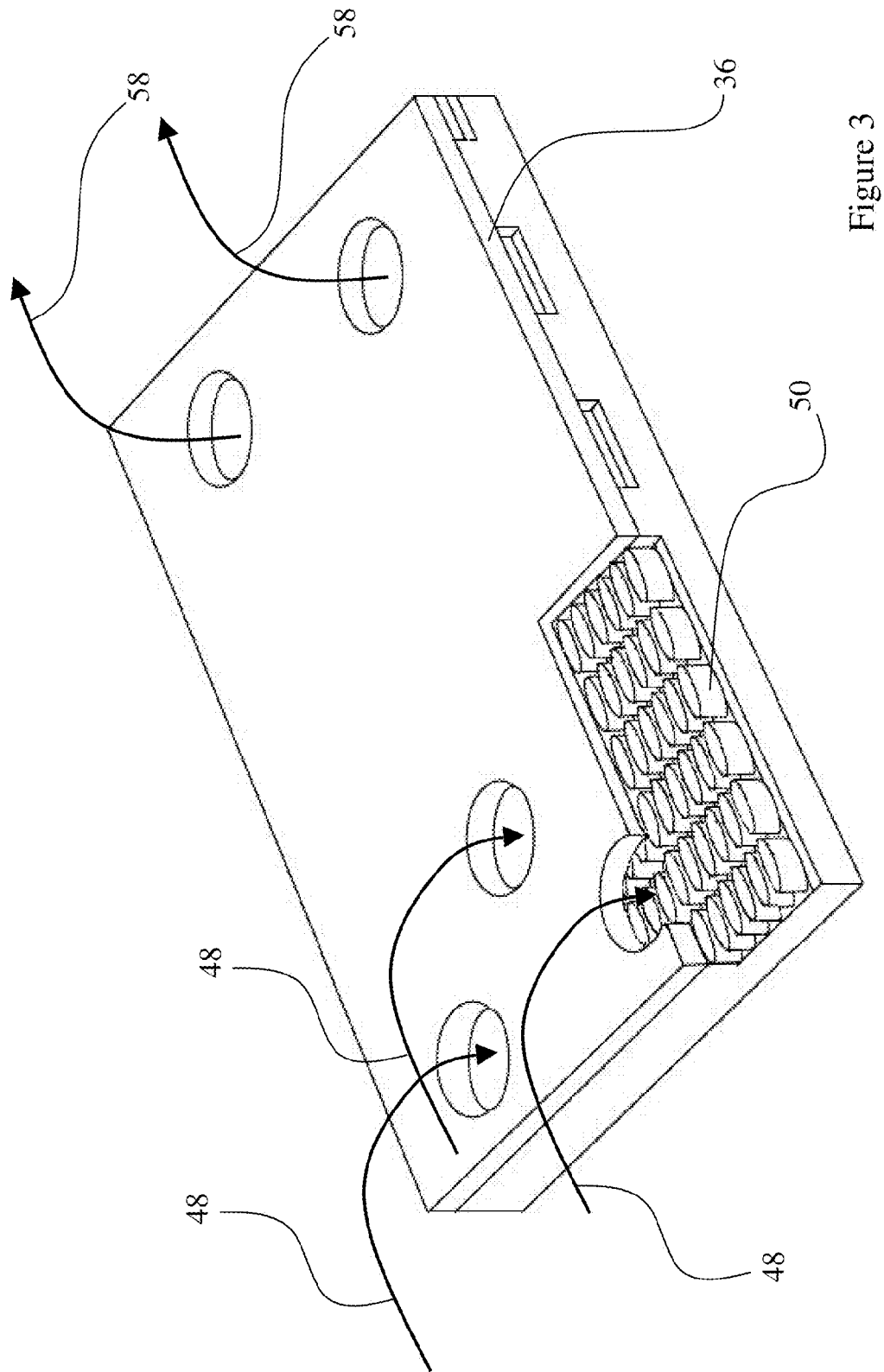
FIG. 3 is a perspective illustration of a cold plate used with the processor of FIG. 2.

The cold plate 36 includes an inlet 48 that is fluidly coupled to receive coolant from the liquid cooling system 30. The coolant enters the cold plate 36 and is distributed over an interior portion 50. The interior portion 50 allows the coolant to flow and cool the first side 40 of the processor chip 34. As illustrated in FIG. 3, the cold plate 36 may include multiple inlets 48 which may optionally be position on the top surface of the cold plate 36. The interior portion 50 may also optionally include fins or divider portions to assist in the transfer of thermal energy and the even distribution of coolant.

Referring now to FIG. 2-6, the liquid cooling of the processor chip 34 will be described. The processor chip 34 generates heat during operation that needs to be dissipated. It is desirable to maintain the processor chip 34 at a temperature between approximately 65° C.-85° C. Since thermal cycling may damage semiconductors and their associated electrical connections, it is further desirable to maintain the chip near a constant temperature. As will be discussed below, due to the low thermal resistance between the processor chip 34 and the coolant, the direct variable flow impingement of coolant on the processor chip 34 reduces the thermal gradient between different locations on the chip to a level below 3° C. Since the thermal gradient between the chip and the coolant water is small, the cooling system 30 can maintain the computer system 22 at a nearly constant temperature even when the computer system 22 is shut down. Further, by maintaining a low thermal gradient, the thermal cycling of the processor and other electronic components is minimized improving reliability.

Figure 4:
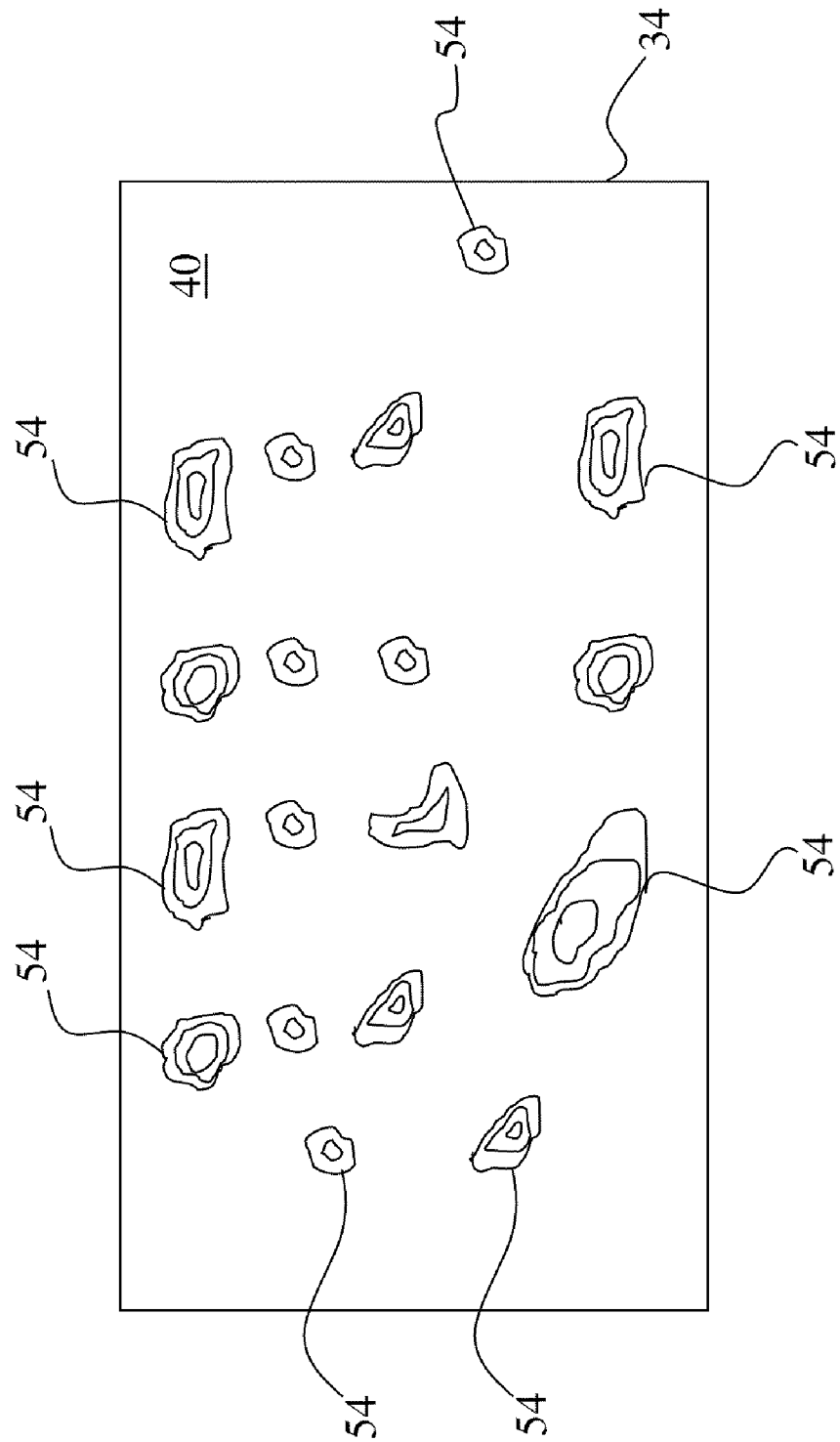
FIG. 4 is an illustration of a power map for the processor of FIG. 2.

The effort to keep the temperature of the processor chip 34 constant and uniform is hampered by the characteristics of the processor chip 34. During operation, the processor chip 34 develops localized hot spots 54. A power map of the processor chip is illustrating the temperature profile for an exemplary load is shown in FIG. 4 at uniform heat removal. The gradient lines illustrated represent topographic curves of temperature. These localized hot spots 54 further complicate the operation of the processor chip 34 because the processor chip 34 includes transistors (not shown) that operate at different speeds depending on temperature. By having transistors operation at different speeds, the processor chip 34 typically must perform synchronization steps to perform the operations properly.

In the exemplary embodiment, the cold plate 36 includes a plurality of coolant nozzles 52. These nozzles direct the coolant from the interior portion to the processor chip first side 40 and return the fluid to the interior portion 50. To further increase the efficiency of the cooling system 30 and minimize temperature differential across the processor chip 34, the nozzles 52 include a first plurality of nozzles 55 having a first diameter and a second plurality of nozzles 57 having a second diameter. The diameter of the second plurality of nozzles 57 is larger than that of the first plurality of nozzles 55 to allow higher flow rates of coolant. In the exemplary embodiment, the nozzles 52 are spaced between 0.1 mm-0.5 mm apart. In general, as the thickness of the processor chip 34 decreases, the distance between the nozzles must also decrease.

Figure 5:
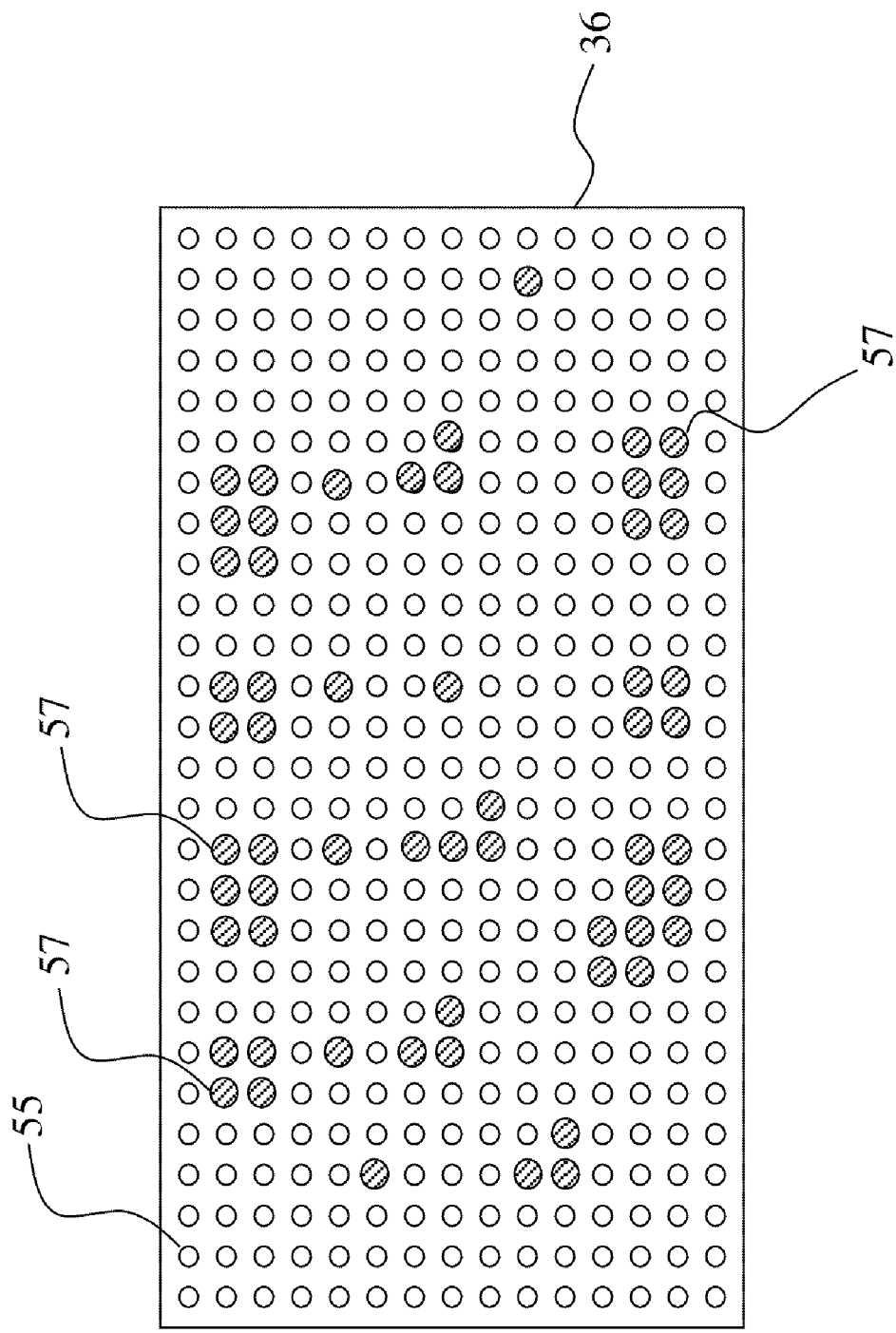
FIG. 5 is a bottom plan view illustration of the exemplary embodiment cold plate used with the processor of FIG. 2.

As illustrated in FIG. 5, the second plurality of nozzles 57 are arranged on the cold plate 36 to be positioned adjacent to the hot spots 54 on the processor chip 34. The cold plate 36 acts as a coolant control device and by arranging the second plurality of nozzles 57 in areas of hot spots 54, higher levels of heat flux may be dissipated. Thus a more uniform junction temperature may be achieved. Where constant coolant flow was used (e.g. all nozzles have the same diameter), a coolant flow of 1.64 l/min was needed to provide cooling to the processor chip 34. By utilizing the different nozzle diameters to allow increased flow at the location of hot spots 54, the flow of coolant was reduced to 0.20 l/min for equivalent levels of cooling. Further, since there was less of a gradient between the coolant exiting the nozzles, the temperature increase of the coolant between the inlet 48 and the outlet 58 rose from 1.0° C. to 8.1° C.

Figure 6:
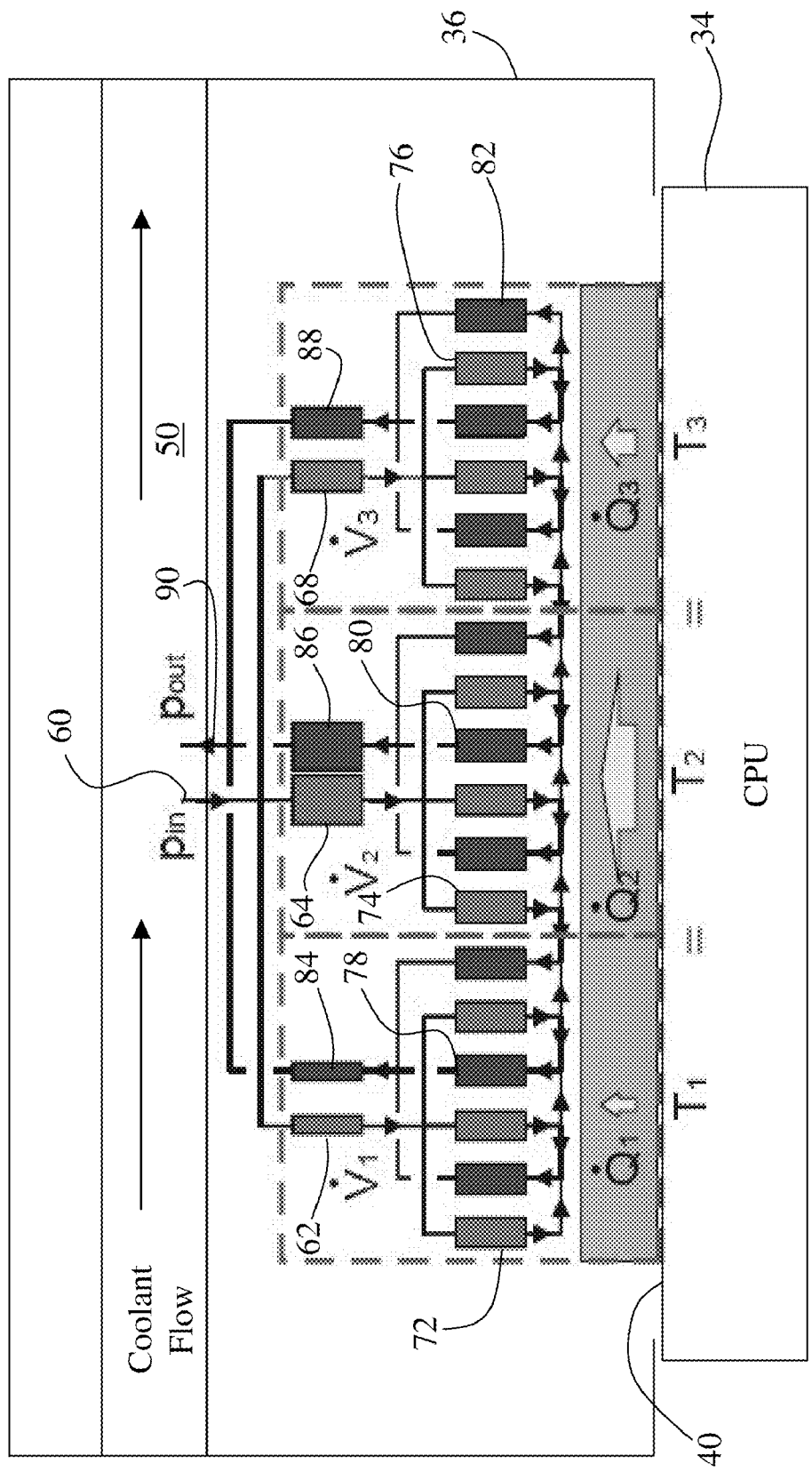
FIG. 6 is a schematic illustration of one embodiment of the liquid cooled processor of FIG. 2.

An alternate embodiment nozzle arrangement is illustrated in FIG. 6. In this embodiment, the nozzles are arranged in a hierarchical manifold with inlet and return nozzles. The coolant exits the interior portion 50 through inlet 60 where it is manifolded into secondary inlets 62, 64, 68. These inlets 62, 64, 68 have different diameters resulting in different flow rates through the respective secondary inlets. Each of the secondary inlets 62, 64, 68 further divide the flow into nozzles 72, 74, 76 that direct the coolant onto the first side 40 of the processor chip 34. A set of return channels 78, 80, 82 return the heated coolant to secondary return channels 84, 86, 88 to outlet 90 that returns the heated coolant to the interior portion 50.

By arranging the nozzles 74 with the highest flow rate $V_2$ to a hot spot 57, the coolant from nozzles 74 provide a greater thermal transfer $Q_2$ than the lower heat flux regions that are cooled by the other nozzles 72, 76. Is should be appreciated that by arranging the flow rates such that $V_2 > V_3 > V_1$, the respective junction temperatures are similar, even at $Q_2 > Q_3 > Q_1$. Further, due to the differences in the flow rates, the temperature differences between the coolants exiting the respective secondary return channels 84, 86, 88 are smaller improving energy efficiency.

Figure 7:
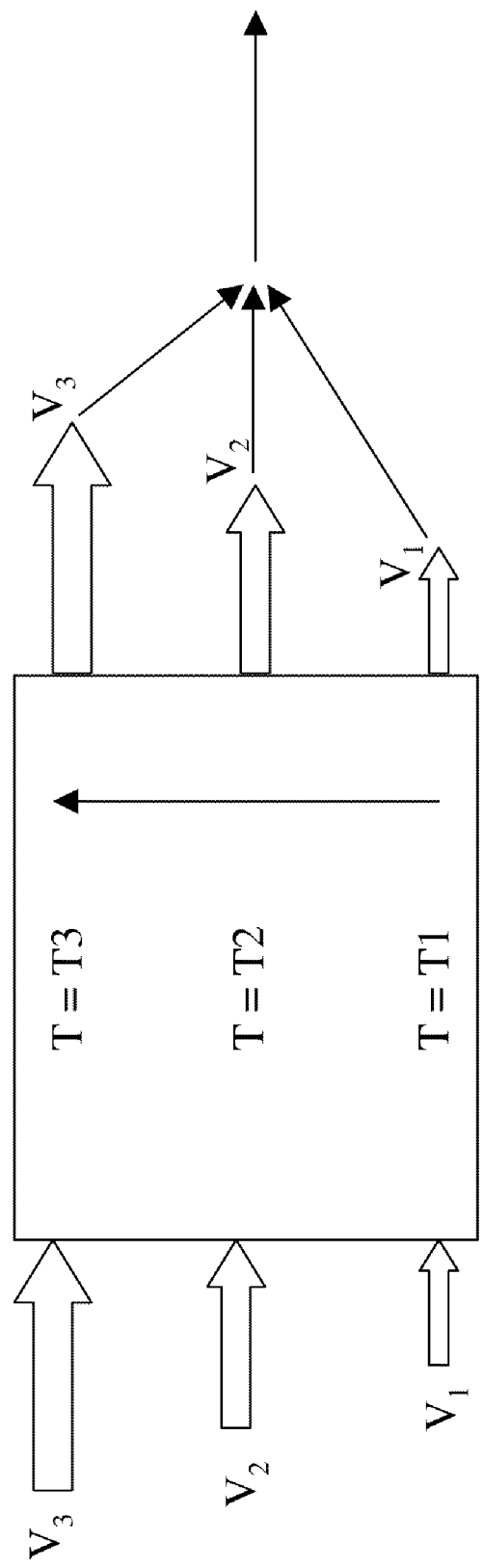
FIG. 7 is schematic illustration of one embodiment of coolant flow across the processor of FIG. 2.
Figure 8:
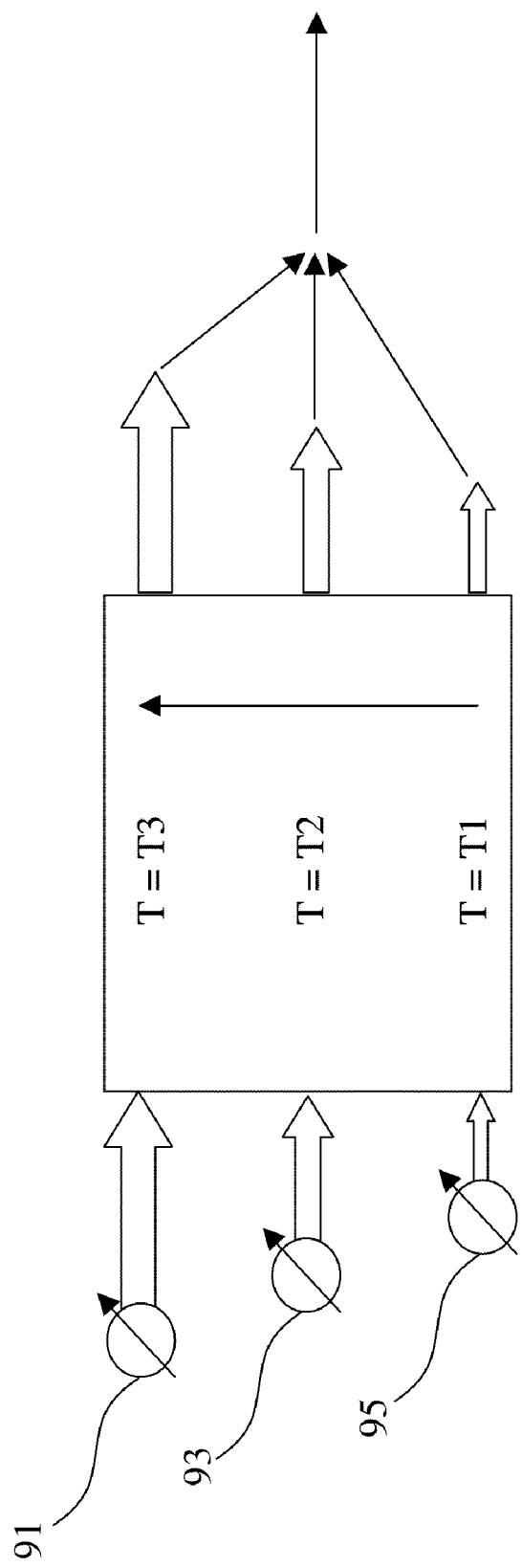
FIG. 8 is a schematic illustration of an alternate embodiment of coolant flow across the processor of FIG. 2.

The effect of having different flow rates is further illustrated in FIGS. 7-8. These figures schematically illustrate the temperature gradient over the surface of the processor chip 34 where $Q_3 > Q_2 > Q_1$. The respective levels of flow rates of the coolant are $V_3 > V_2 > V_1$. The high flow rates are directed to static regions with high expected load condition. As a result of this arrangement, higher flow rate $V_3$ absorbs more thermal energy, however, the existing temperature of the coolant remains close or the same as the lower flow rate $V_1$. In other words, the thermal transfer per unit of coolant volume remains the same across the surface of the processor chip 34.

FIG. 8 illustrates a different embodiment that utilizes active or passive proportional valves 91, 93, 95. The use of a proportional valve allows for the dynamic changing of the flow rates of coolant to the processor chip 34. Therefore, as load conditions change and different regions of the processor chip 34 become active, the flow rates of coolant may be correspondingly changed. The changing of the flow rates may be accomplished in a number of ways, for example, a controller in the cooling system may include a set of power maps indicating the temperature gradients and localized hot spots under the expected operating conditions. As the controller detects a change in the operation of the processor chip 34, the controller uses the power map associated with the new load condition. In the exemplary embodiment, the controller includes at least 100 power maps that provide data of the temperature distributions of the processor chip 34 and the desired coolant flow rates. In alternate embodiments, the controller includes two power maps, one for peak load performance, and one for off-peak performance.

By providing variable flow rates of coolant to the processor chip 34, lower flow rates of coolant are required. This provides advantages in the operation of the computer system 22 and the data center 20. Lower flow rates conserve pumping power, preserve exergy and allow more uniform chip temperature. As should be appreciated, a more uniform chip temperature reduces the thermal cycling of the processor chip and also minimizes the speed differences between the processor chip's 34 transistors. In the exemplary embodiment, the processor chip 34 temperature is maintained at a constant temperature +/−3° C. This provides further advantages in allowing a reduction in the supply voltage and a reduction in the leakage currents that have exponential temperature dependence.

In addition to the processor 24, other components within the computer system 22 require cooling to dissipate generated heat. One of these components is the group of ancillary electrical components 26 that support the operation of processor 24. In general, the junction temperature limits of ancillary electrical components 26 are higher than that of the processor 24 while also having a lower heat flux. For example, a processor at 85° C. has a local heat flux of up to 300 W/cm$^2$, while a DC-DC converter has a maximum temperature of 115° C. at 20 W/cm$^2$. By taking advantage of these thermal characteristics, the cooling system 30 may be arranged to remove thermal energy serially to maximize the output coolant temperature from the computer system 22.

Figure 9:
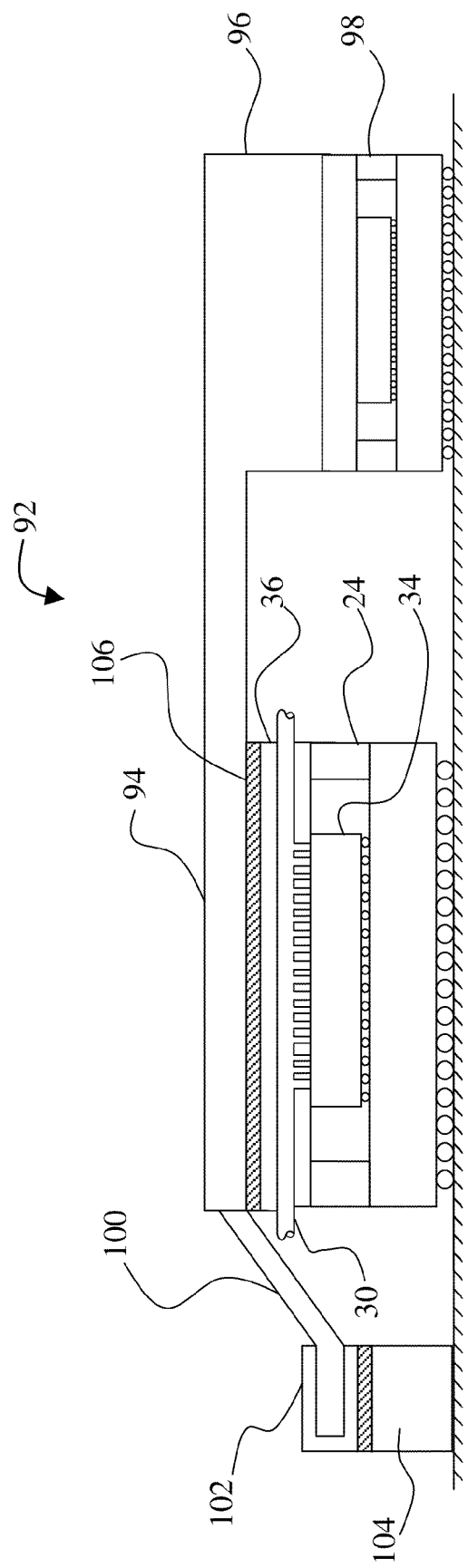
FIG. 9 is a side plan view of a computer system cooling system using a conductive heat collector.

One embodiment of a thermal cooling loop 92 within the computer system 22 is illustrated in FIG. 9. In this embodiment, the processor 34 is liquid cooled by cooling system 30 discussed above. A conductive collector 94 is coupled to the cold plate 36 opposite from the processor chip 34. The conductive collector may be any suitable material such as a metal that is thermally conductive. The conductive collector 94 has a second portion 96 that is coupled in thermal communication with a heat sink on ancillary electrical component 98. The conductive collector 94 further has a third portion 100 coupled to a heat sink 102 on another ancillary electrical component 104. An optional thermal interface material 106, such as thermal grease, may be arranged between the cold plate 36 and the conductive collector 94.

Owing to its contact with the cold plate 36, the conductive collector 94 will transfer thermal energy from the ancillary electrical components 98, 104 to the cold plate 36. Since the conductive collector 94 is less efficient than the liquid cooling of the processor chip 34, the thermal transfer to the backside of the cooling plate 36 will be more moderate than between the cooling plate and the processor chip. This arrangement enables to provide adequate cooling to the ancillary electrical components 26 while maintaining the processor chip 34 at a constant temperature. It should be appreciated that while FIG. 9 shows the conductive collector 94 as being coupled to two ancillary components 98, 104, the embodiment is not so limited and an the conductive collector may be expanded to be in thermal communication with all ancillary electrical components that need cooling.

Figure 10:
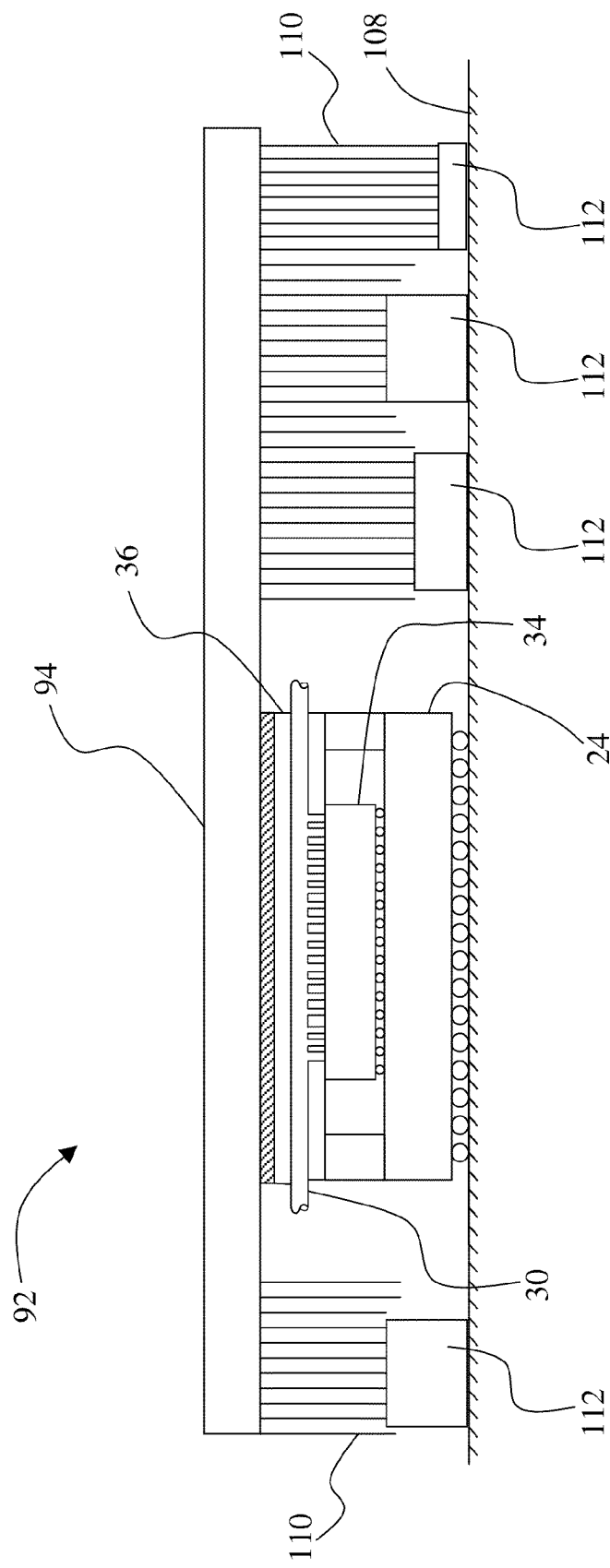
FIG. 10 is side plan view of an alternate embodiment computer cooling system using a compliant heat collector.

An alternate embodiment thermal cooling loop 92 is illustrated in FIG. 10. In this embodiment, the conductive collector 94 is coupled and in thermal communication with the cold plate 36 as described above. The conductive collector 94 is configured in a planar manner parallel to the plane of the substrate 108 on which the processor 24 and electrical components 26 are mounted. Extending from the bottom side of the conductive collector is a compliant heat collector 110. The heat collector 110 extends into thermal communication with each of the electrical components 112. The heat collector 110 may be any suitable material, including metal fins, metallic foam or springs for example, that can comply to the different surface heights of components and is capable of conducting thermal energy from the electrical components 112 to the conductive collector 94. It should be appreciated that the heat collector 110 may be coupled to the conductive collector 94 to allow ease of serviceability and maintenance.

Figure 11:
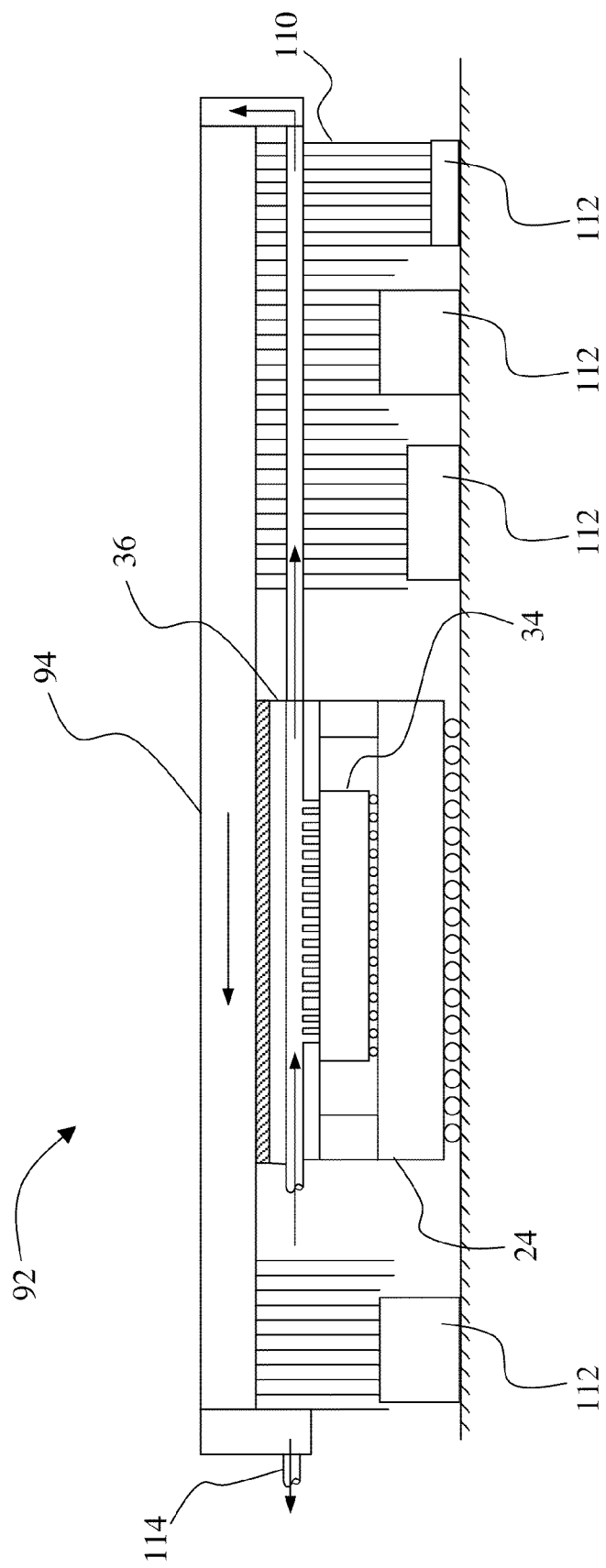
FIG. 11 is a side plan view of another alternate embodiment computer cooling system with a liquid cooled conductive collector.

FIG. 11 illustrates another alternate embodiment thermal cooling loop 92. In this embodiment, the conductive collector 94 and heat collector 110 are arranged as discussed above with reference to FIG. 10. The cooling system 30 extends past the processor 24 into contact and thermal communication with the heat collector 110. The liquid coolant then continues back through the conductive collector 94 and exits via outlet 114. By extending the liquid coolant system 30 into the heat collector 110, the thermal resistance from the electrical components to the coolant is less, thus providing a higher coolant temperature.

Figure 12:
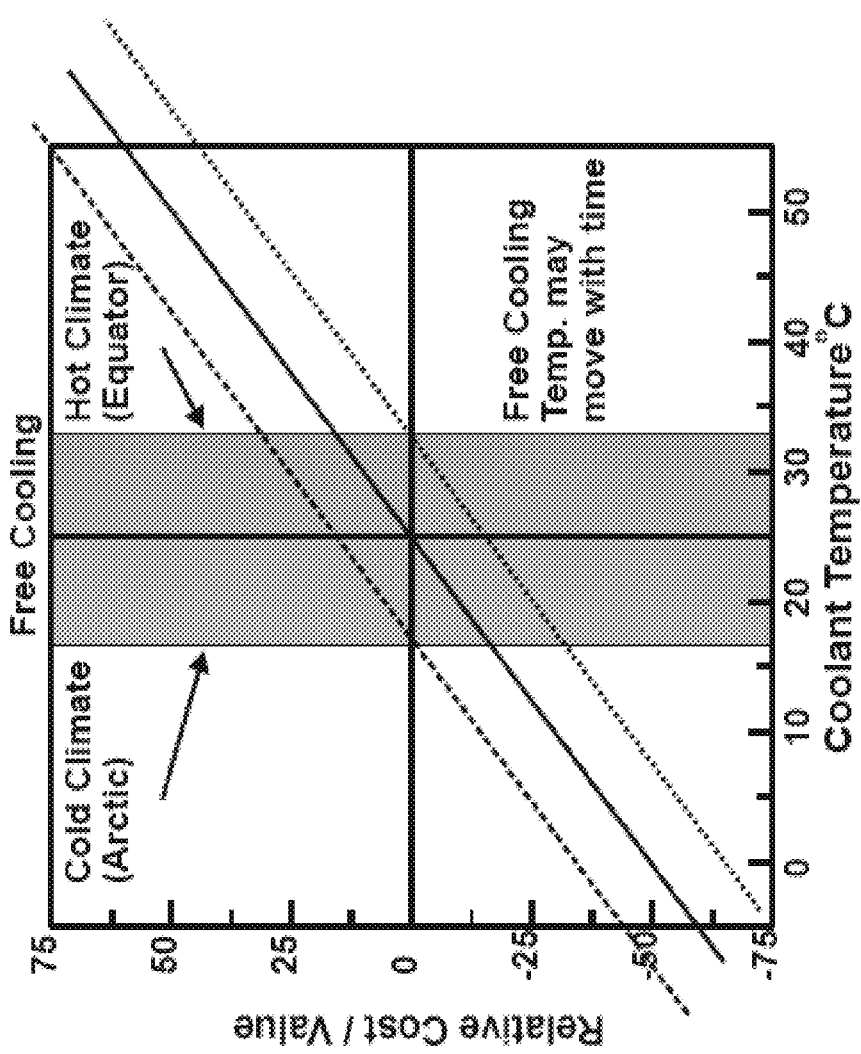
FIG. 12 is a graph illustrating the relative cost of cooling vs coolant temperature; and, FIG. 13 is a schematic illustration of a data center coupled with a district heating system to minimize total carbon emissions.

The embodiments illustrated in FIGS. 1 and 11 provide for a serial cooling of the processor 24 and the electrical components 26. As shown in FIG. 1, the coolant system 30 then comes into thermal communication with the power electronics 28. This serial arrangement allows for an efficient cooling of the computer system 22 and provides a coolant with a desirable exit temperature as well. In the exemplary embodiment, the coolant enters that computer system 22 at a temperature 28° C. less than the junction temperature of the processor chip 34. Thus where the junction temperature is desired to be 85° C., the coolant need only enter at 57° C. This results in the coolant having an exit temperature after absorbing thermal energy from the processor 24, electrical components 26, and power electronics 28, of 57° C. when the processor is idle and of 65° C. when the processor 24 runs at full power. To avoid low coolant output temperatures a valve drastically reduces the flow when the processor is switched off or maximally throttled. Since the average ambient temperature, also known as the free cooling temperature, is less than 30° C., the thermal energy from the coolant may be removed using a cooler, such as a roof cooler for example, and the chiller that was required by the prior art may be eliminated. As illustrated in FIG. 12, the free cooling temperature varies between approximately 17° C. in arctic climates and 33° C. in equatorial climates. Thus, the exit temperature of the coolant in the exemplary embodiment may be cooled without a chiller in virtually any environment. Peak temperatures during hot seasons and at daytime can be higher than the average values given in FIG. 12 but a coolant output temperature of 57° C. would even allow free cooling at exceptional ambient temperatures of 55° C.

This temperature differential between the free cooling temperature and the output temperature of the coolant from the computer system creates an opportunity to make additional usage of energy that had previously been waste heat. In prior art data center cooling systems, the usage of the heat generated was not commercially compelling since output fluid temperature of the air cooled systems was not of sufficient quality (e.g. fluid temperature was too low) to be used for process or residential heating. Typically, the prior art systems required an auxiliary device, such as a heat pump for example, to raise the temperature of the waste heat to a useful temperature. This need additional electrical energy in the prior art reduced its efficiency and commercial viability. However, where the temperature differential between coolant is 20° C. or greater than the free cooling temperature, the generated heat may be captured and further utilized without need for additional electrical energy.

In metropolitan areas, it is not uncommon for a central boiler system to be used to generate heat for multiple facilities or residences in the surrounding area. This heating system is sometimes referred to as district heating or teleheating. The hot water is transported via insulated pipes to subscribing buildings, which purchase the hot water. It should be appreciated that purchasing of hot water for heating purposes from a centralized location provides for greater efficiency and a larger utilization of the energy source over distributed heating arrangement. As will be discussed below, the use of a centralized heat source also provides the opportunity to offset carbon emissions.

Figure 13:
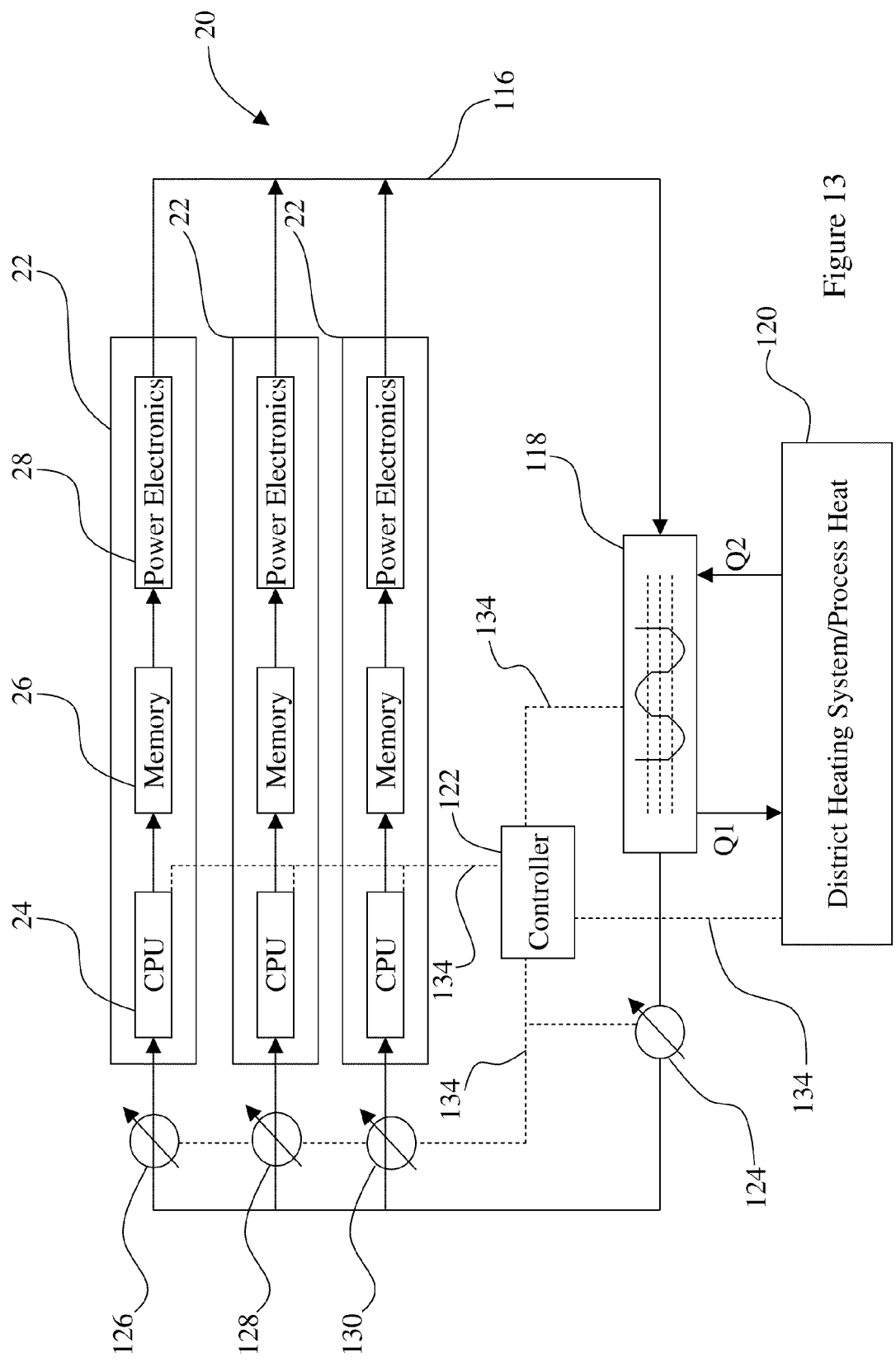

An exemplary embodiment system for capturing heat from data center 20 for reuse as process heat, commercial heating or residential heating is illustrated in FIG. 13. In this embodiment, the data center 20 includes a plurality of computer systems 22 that include a processor 24, electrical components 26, and power electronics 28. A liquid coolant system 116 circulates a coolant, such as water for example, through heat exchanger 118 and through the computer systems 22 where the coolant absorbs thermal energy. A district heating system 120 is coupled to receive thermal energy from the heat exchanger 120. It should be appreciated that district heating system 120 may be comprised of residential buildings, commercial buildings, industrial buildings or a combination of thereof.

The cooling system 116 further includes coolant control devices 124, 126, 128, 130. The coolant control devices may be a valve, such as a proportional valve, that are capable of changing the amount of coolant flow through the cooling system 116. In the exemplary embodiment, the coolant control devices are capable transmitting signals to the controller 122. The coolant control devices are further capable of receiving a signal from the controller 122 and changing the state of the devices operation, changing the rate of flow of the coolant for example, in response to receiving the signal from controller 122. The coolant control device 124 is arranged between the heat exchanger 118 and the computer systems 22. The coolant control device 124 allows the controller 122 to adjust the overall flow of the cooling system 116. The coolant control devices 126, 128, 130 are arranged to control the flow of coolant into the inlets of individual computer systems 22.

A controller 122 is electrically coupled to monitor the operation of the cooling system 116 and the demands from district heating system 120. The controller 122 is a suitable electronic device capable of accepting data and instructions, executing the instructions to process the data, and presenting the results. The controller 122 may include one or more processors. Controller 122 may accept instructions through a user interface, or through other means such as but not limited to electronic data card, voice activation means, manually-operable selection and control means, radiated wavelength and electronic or electrical transfer. Therefore, controller 32 can be a microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, a personal digital assistant (PDA) or a hybrid of any of the foregoing.

Controller 122 is capable of converting the analog voltage or current level provided by sensors, such as temperature sensors for example, into a digital signal indicative of the heat generated by the computer system 22 or return water temperature from district heating system 120. Alternatively, sensors may be configured to provide a digital signal to controller 122, or an analog-to-digital (A/D) converter maybe coupled between sensors and controller 122 to convert the analog signal provided by the sensors into a digital signal for processing by controller 122. Controller 122 uses the digital signals as input to various processes for controlling the cooling system 116. The digital signals represent one or more cooling system 116 data including but not limited to flow rates through coolant control devices 124, 126, 128, 130 and the like.

Controller 122 is operably coupled with one or more components of data center 20 by data transmission media 134. Data transmission media 134 includes, but is not limited to, solid-core wiring, twisted pair wiring, coaxial cable, and fiber optic cable. Data transmission media 134 also includes, but is not limited to, wireless, radio and infrared signal transmission systems. Controller 122 communicates over the data transmission media 122 using a well-known computer communications protocol such as Inter-Integrated Circuit (I2C), Serial Peripheral Interface (SPI), System Management Bus (SMBus), Transmission Control Protocol/Internet Protocol (TCP/IP), RS-232, ModBus, or any other communications protocol suitable for the purposes disclosed herein.

In general, controller 122 accepts data from sensors, such as temperature sensors for example, and devices such coolant control device 124 for example. Controller 122 is also given certain instructions from an executable instruction set for the purpose of comparing the data from sensors to predetermined operational parameters such as a desired coolant exit temperature. Controller 122 provides operating signals to operate coolant control device 124 for example. Controller 122 also accepts data from district heating system 120, indicating, for example, whether the heat demand from users on the system is increasing or decreasing. The controller 122 compares the operational parameters to predetermined variances (for example, coolant temperature, processor operating state, heat demand) and if the predetermined variance is exceeded, generates a signal that may be used to indicate an alarm or message to an external device. Additionally, the signal may initiate other control methods that adapt the operation of the cooling system 116 such as changing the operational state of coolant control device 124 to compensate for the out of variance operating parameter.

Controller 122 includes a processor coupled to a random access memory (RAM) device, a non-volatile memory (NVM) device, a read-only memory (ROM) device, one or more input/output (I/O) controllers, and a data interface device. I/O controllers may also be coupled to one or more analog-to-digital (A/D) converters, which receive analog data signals from sensors.

A data interface device provides for communication between controller 122 and an external device, such as a computer, a laptop or a computer network for example, in a data communications protocol, such as but not limited to USB (universal serial bus) or JTAG (joint test action group) for example, supported by the external device. ROM device stores an application code, e.g., main functionality firmware, including initializing parameters, and boot code, for processor. Application code also includes program instructions for causing processor to execute any operation control methods, including starting and stopping operation, changing coolant control devices 124, 126, 128, 130, monitoring predetermined operating parameters such as measurements by sensors and generation of data signals.

The NVM device is any form of non-volatile memory such as an EPROM (Erasable Programmable Read Only Memory) chip, a flash memory chip, a disk drive, or the like. Stored in NVM device are various operational parameters for the application code. The various operational parameters can be input to NVM device either locally, using a user interface (not shown) or remotely via the data interface. It will be recognized that application code can be stored in NVM device rather than ROM device.

Controller 122 also includes operation control methods embodied in application code. These methods are embodied in computer instructions written to be executed by processor, typically in the form of software. The software can be encoded in any language, including, but not limited to, machine language, assembly language, VHDL (Verilog Hardware Description Language), VHSIC HDL (Very High Speed IC Hardware Description Language), Fortran (formula translation), C, C++, Visual C++, Java, ALGOL (algorithmic language), BASIC (beginners all-purpose symbolic instruction code), visual BASIC, ActiveX, HTML (HyperText Markup Language), and any combination or derivative of at least one of the foregoing. Additionally, an operator can use an existing software application such as a spreadsheet or database and correlate various cells with the variables enumerated in the algorithms. Furthermore, the software can be independent of other software or dependent upon other software, such as in the form of integrated software.

During operation, the controller 122 receives signals required for normal operation and in particular for the control of the flow of coolant to the computer systems 22 and to the district heating system 120. The inputs include temperature sensors located within the computer system, operation states of coolant control devices 124, 126, 128, 130, and thermal demand from district heating system 120. Based upon these inputs, the controller 122 provides signals to the coolant control devices 124, 126, 128, 130. In one embodiment, the liquid cooling system 116 is operated to maximize the temperature of coolant exiting the computer system while maintaining low enough processor chip 34 temperature. In one embodiment, the processor chip 34 is maintained at a temperature of 75° C. and an exit coolant temperature of 55° C. In another embodiment, the controller 122 operates the liquid cooling system 116 to maintain the temperature of the coolant exiting the computer systems at least 20° C. above the ambient temperature but generally not higher than 65° C. It should be appreciated that for a relatively large dry roof cooler a temperature gradient of 5° C. is typically required to be able to transfer the heat from the coolant to the air. The size of the roof cooler may be smaller when a temperature gradient of 20° C. is available.

Controller 122 is further capable of operating each of the coolant control devices 124, 126, 128, 130 independently to accommodate the individual operational states of the computer systems 22. In this way, the controller 122 can maximize the temperature of the coolant exiting each of the computer systems 22. This embodiment provides advantages maximizing the exergy of the data center 20 by extracting the amount of thermal energy from the computer systems 22 and utilizing the thermal energy as a heat source for residences, commercial facilities or as process heat. In the exemplary embodiment, the data center offsets 360 tons of carbon dioxide emissions per year through the repurposing of the heat generated by the computer systems 22. The selling of thermal energy, and the offsetting of carbon emissions may reduce the cost of operating the data center, or the total cost of ownership by up to 50%.

The capabilities of some embodiments disclosed herein can be implemented in software, firmware, hardware or some combination thereof. As one example, one or more aspects of the embodiments disclosed can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the disclosed embodiments can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A computer system comprising:
a processor having a first side and a second side;
a group of memory components electrically coupled to said processor;
a power electronics module electrically coupled to provide electrical power to said processor and said group of memory components;
a liquid cooling loop thermally coupled to said power electronics module; and,
a cold plate thermally coupled to said processor and fluidly coupled to said liquid cooling loop, said cold plate including:
a first inlet fluidly coupled to the liquid cooling loop;
a second inlet fluidly coupled in series with said first inlet;
a third inlet fluidly coupled in series with said first inlet;
a first plurality of nozzles having a first diameter fluidly coupled in series with said second inlet;
a second plurality of nozzles having a second diameter said second diameter being larger than said first diameter, the second plurality of nozzles being fluidly coupled in series with said third inlet; and,
a first plurality of channels fluidly coupled to said first plurality of nozzles and said second plurality of nozzles;
wherein said first plurality of nozzles and said second plurality of nozzles are arranged to directly flow a cooling fluid to said processor first side and said first plurality of channels are arranged to flow said cooling liquid from said processor first side to said liquid cooling loop;
a conductive collector thermally coupled to said liquid cooling loop, the conductive collector having a first conductive collector portion thermally coupled to said cold plate and a second conductive collector portion adjacent to said group of memory components; and,
a heat collector disposed between said second conductive collector portion and said group of memory components.

2. The computer system of claim 1 wherein said processor first side includes a first processor portion operating at a first temperature and a second processor portion operating a second temperature.

3. The computer system of claim 2 wherein said first plurality of nozzles is positioned adjacent said first processor portion and said second plurality of nozzles is position adjacent said second processor portion.

4. The computer system of claim 3 wherein said first conductor collector portion is arranged on an opposite side of said cold plate from said processor.

5. The computer system of claim 1 wherein said second inlet has a third diameter and a third inlet has a fourth diameter, wherein said fourth diameter is larger than said third diameter.

6. The computer system of claim 5 further comprising a second plurality of channels fluidly coupled to flow said cooling fluid from said first plurality of channels to said liquid cooling loop.

7. A computer system comprising:
   a processor having a first side and a second side, wherein said processor first side includes a first portion operating at a first temperature and a second portion operating a second temperature;
   a group of memory components electrically coupled to said processor;
   a power electronics module electrically coupled to provide electrical power to said processor and said group of memory components;
   a liquid cooling loop thermally coupled to said processor, said group of memory components and said power electronics module;
   a cold plate thermally coupled to said processor and fluidly coupled to said liquid cooling loop, said cold plate including:
   a first plurality of nozzles having a first diameter and positioned adjacent said first portion;
   a second plurality of nozzles having a second diameter said second diameter being larger than said first diameter, said second plurality of nozzles is position adjacent said second portion; and,
   a first plurality of channels fluidly coupled to said first plurality of nozzles and said second plurality of nozzles;
   wherein said first plurality of nozzles and said second plurality of nozzles are arranged to directly flow a cooling fluid to said processor first side and said first plurality of channels are arranged to flow said cooling liquid from said processor first side to said liquid cooling loop;
   a conductive collector, said conductive collector having a first conductor collector portion thermally coupled to said cold plate and arranged on an opposite side of said cold plate from said processor, and a second conductor collector portion positioned adjacent to said group of memory components; and,
   a heat collector coupled between said conductive collector and said power electronics module.

8. The computer system of claim 7 wherein said heat collector is selected from a group consisting of a compliant metallic fin, a metal foam, and a spring.

9. A computer system comprising:
   a processor having a first side and a second side;
   a group of memory components electrically coupled to said processor;
   a power electronics module electrically coupled to provide electrical power to said processor and said group of memory components;
   a liquid cooling loop thermally coupled to said power electronics module;
   a cold plate thermally coupled to said processor and fluidly coupled to said liquid cooling loop, said cold plate including:
   a first inlet having a first diameter fluidly coupled to said liquid cooling loop;
   a second inlet having a second diameter fluidly coupled in series to said first inlet;
   a third inlet having a third diameter fluidly coupled in series to said first inlet, said third diameter being larger than said second diameter;
   a first nozzle fluidly coupled to said second inlet;
   a second nozzle fluidly coupled to said third inlet;
   a first channel fluidly coupled to said first nozzle; and,
   a second channel fluidly coupled to said second nozzle;
   wherein said first nozzle is arranged to direct a first flow of a cooling fluid to said processor first side at a first velocity and said second nozzle is arranged to direct a second flow of said cooling fluid to said processor first side at a second velocity; and,
   wherein said first channel and said second channel are arranged to flow said cooling fluid from said processor first side to said liquid cooling loop;
   a conductive collector thermally coupled between said liquid cooling loop and said processor, said conductive collector having a first conductive collector portion thermally coupled to said cold plate and a second conductive collector portion adjacent to said group of memory components; and,
   a heat collector disposed between said second conductive collector portion and said group of memory components.

10. The computer system of claim 9 further comprising:
    a fourth inlet having a fourth diameter fluidly coupled to said liquid cooling loop, said fourth diameter being larger than said third diameter;
    a third nozzle fluidly coupled to said fourth inlet; and,
    a third channel fluidly coupled to said third nozzle;
    wherein said third nozzle is arranged to direct a third flow of said cooling fluid to said processor first side at a third velocity.

11. The computer system of claim 10 wherein said processor first side includes a first portion operating at a first temperature and a second portion operating a second temperature.

12. The computer system of claim 11 wherein said first nozzle flows said cooling fluid to said first portion and said second nozzle flows said cooling fluid to said second portion.

13. The computer system of claim 12 wherein said
    first conductor collector portion is thermally coupled to said cold plate on an opposite side of said cold plate from said processor.

14. A computer system comprising:
    a processor having a first side and a second side, wherein said processor first side includes a first portion operating at a first temperature a second portion operating a second temperature, and a third portion;
    a group of memory components electrically coupled to said processor;
    a power electronics module electrically coupled to provide electrical power to said processor and said group of memory components;
    a liquid cooling loop thermally coupled to said processor, said group of memory components and said power electronics module;
    a cold plate thermally coupled to said processor and fluidly coupled to said liquid cooling loop, said cold plate including:
    a first inlet having a first diameter fluidly coupled to said liquid cooling loop;
    a second inlet having a second diameter fluidly coupled to said liquid cooling loop, said second diameter being larger than said first diameter;
    a third inlet having a third diameter fluidly coupled to said liquid cooling loop, said third diameter being larger than said second diameter;
    a first nozzle fluidly coupled to said first inlet;
    a second nozzle fluidly coupled to said second inlet;
    a third nozzle fluidly coupled to said third inlet;
    a first channel fluidly coupled to said first nozzle;
    a second channel fluidly coupled to said second nozzle; and, a third channel fluidly coupled to said third nozzle;
wherein said first nozzle is arranged to direct a first flow of a cooling fluid to said processor first side at a first velocity, said second nozzle is arranged to direct a second flow of said cooling fluid to said processor first side at a second velocity, and said third nozzle is arranged to direct a third flow of said cooling fluid to said processor first side at a third velocity,
wherein said first nozzle flows said cooling fluid to said first portion, said second nozzle flows cooling fluid to said second portion, and said third nozzle flows said cooling fluid to said third portion; and
wherein said first channel, said second channel, and said third channel are arranged to flow said cooling fluid from said processor first side to said liquid cooling loop;

a conductive collector thermally coupled to said cold plate, wherein said conductive collector includes a first conductor collector portion thermally coupled to said cold plate opposite said processor, and a second conductor collector portion positioned adjacent to said group of memory components; and,
a heat collector coupled between said conductive collector and said power electronics module.

15. The computer system of claim 14 wherein said heat collector is selected from a group consisting of a compliant metallic fin, a metal foam, and a spring.

* * * * *